United States Patent [19]

Sultan et al.

[11] Patent Number: 5,382,547
[45] Date of Patent: Jan. 17, 1995

[54] VOID FREE OXIDE FILL FOR INTERCONNECT SPACES

[76] Inventors: Pervaiz Sultan, 7432 Phinney Way, San Jose, Calif. 95139; Steven C. Avanzino, 7504 Barnhart Pl., Cupertino, Calif. 95014

[21] Appl. No.: 922,897

[22] Filed: Jul. 31, 1992

[51] Int. Cl.$^6$ ............... H01L 21/316; H01L 21/443; H01L 21/467
[52] U.S. Cl. ............................ 437/231; 437/978
[58] Field of Search ............... 437/228, 231, 978; 148/DIG. 51

[56] References Cited

U.S. PATENT DOCUMENTS

| | | | |
|---|---|---|---|
| 4,481,070 | 11/1984 | Thomas et al. | 156/643 |
| 4,986,878 | 6/1991 | Malazgirt et al. | 156/643 |
| 5,032,541 | 7/1991 | Sakamoto et al. | 437/203 |
| 5,119,164 | 6/1992 | Sliwa, Jr. et al. | 357/34 |
| 5,192,715 | 3/1993 | Sliwa, Jr. et al. | 437/195 |
| 5,204,288 | 4/1993 | Marks et al. | 437/228 |

FOREIGN PATENT DOCUMENTS

| | | | |
|---|---|---|---|
| 0423907A1 | 10/1989 | European Pat. Off. | |
| 9204809 | 2/1992 | European Pat. Off. | 437/231 |
| 0077140 | 3/1990 | Japan | 437/231 |

OTHER PUBLICATIONS

Muraka, Electronic Materials, Science and Technology, pp. 329–332 (Date Unknown).
Wolf, "Silicon Processing for the VLSI Era, vol. II: Process Integration" pp. 222–235, 1990.

*Primary Examiner*—Olik Chaudhuri
*Assistant Examiner*—Richard A. Booth

[57] ABSTRACT

An improved interconnect space filling process which provides voidless space filling for aspect ratio $\leq 1.88$ by adding one step to the prior art process to change the aspect ratio of the space to be within specification aspect ratios for the older process. The added step is to apply a highly viscous single spin of SOG after applying a thin CVD PETEOS layer overtop the metallization.

7 Claims, 3 Drawing Sheets

VOID FREE OXIDE FILL FOR INTERCONNECT SPACES

FIELD OF THE INVENTION

The present invention relates to a method for making void free multilevel dielectric layers on an integrated circuit having multilayer metallic interconnections.

BACKGROUND OF THE INVENTION

The majority of connection between parts of an integrated circuit are made by low resistance metal steps which are called metal interconnects. Three levels are now being necessary. Generally, the active semiconductor portions of an integrated circuit are coated with an insulative dielectric layer and the metal interconnects are laid down in parallel strips on top of these insulator layers using photolithographic techniques. Until recently, the majority of integrated circuits employed two levels of interconnects. Each level is comprised of a plurality of separated metal strip interconnects formed on the surface of a dielectric. Each interconnect level has to be lithographically patterned, metallized, coated with dielectric and planarized.

There are many processes for forming the interlevel dielectric layers. Generally, the interconnect dielectric fill steps and the planarization step are separate steps. After the interconnect dielectric spaces are filled with oxide, the surface is uneven and needs smoothing. One common planarization technique called CVD etchback employs spin-on-glass (SOG) (or a resist) in conjunction with chemical vapor deposition (CVD) of an oxide to smooth the oxide surface. SOG is easy and fast to apply and harden. The application of SOG alone as a planarizing layer has also been reported. However SOG is not successful if used alone as a dielectric for filling interconnect spaces. Simple SOG fill is not adequate for various reasons including cracking during curing due to shrinkage when aspect ratios are low, i.e. less than 1.

One technique described in U.S. Pat. No. 5,119,164 uses SOG in interconnect fill and overcomes the cracking problems but allows the SOG to remain on the finished circuit. It is reported that SOG can cause deterioration and shift in the threshold levels of transistors if the SOG is allowed to remain permanently on the integrated circuit.

In the CVD/SOG etchback interlayer planarization process, conformal thick CVD layers are overlain with SOG, then the surface is etched back until the surface is flat. In these processes, SOG is frequently allowed to remain in place on the circuit in the very lowest regions. Usually, the surface including the SOG is then overlain with thick CVD oxide to form a smooth surface.

As depicted in FIG. 4 of the U.S. Pat. No. 5,119,164 when using SOG, narrow spaces between the SOG plug and the metal interconnect strips would not fill with SOG during spin, leaving void spaces as, i.e. so called "keyholes", indicated in that patent. In certain instances, the voids can be beneficial because they have a very high dielectric constant. However, in general, the voids are undesirable especially if there are any subsequent etch steps in the process.

With reference to FIG. 1 of this patent, it is known in interconnect space fill processes using CVD oxide that void areas called "keyholes" form in the oxide 10 in the region between the metal strips 2 and 2'. It is known that the void situation can be overcome, as depicted in FIG. 2 by sloping the sidewalls of the gap 6. This is accomplished by RIE etching, employing so called "etch back" of the oxide, the result of which is illustrated in FIG. 2A and 2B. The etchback creates oxide fillets, 5 and 5' along the side walls of metal strip interconnects 2 and 2'. In order to assure that the slope is as large as possible, the oxide is removed all the way down to the top of the metal 2. Frequently, this results in etching vertically into and beneath the underlying dielectric surface 3, forming a small trench space, 6. This trench forms because the distance between the interconnects is frequently less than the thickness of the oxide layer to be etched away. After the etchback, CVD oxide is again deposited over the metal interconnects of FIG. 2A and because of the sloped shape caused by the fillets 5 and 5', the space between the interconnects fills completely with oxide as in FIG. 2B without forming the voids such as those shown in FIG. 1. Note that the surface 10 is still not smooth and that planarization steps are required.

This voidless dielectric etchback prior art technique of FIG. 2A and 2B for forming the interlevel dielectric has only been successful to fill the spaces between level 1 interconnects without keyholes where the interconnects are less than 0.6 microns high and the spaces between them is greater than 0.5 microns wide. Level 1 is the metal closest to the active circuits. In the available etching equipment, metal layers 2 and 3 are only able to be successfully filled, i.e. without voids, for spaces up to 1.0 microns high and for widths greater than 0.8 microns wide. For spaces of width less than 0.8 microns wide, in layers 2 and/or 3, oxide keyhole voids are likely to form using the etchback fillet procedure.

As the density of devices and interconnections on integrated circuits has increased, a need has developed for a process providing voidless levels $\frac{2}{3}$ dielectric for interconnect spacings less than 0.8 microns in width.

SUMMARY OF THE INVENTION

The objective of this invention is to provide a process capable of creating an interlevel dielectric in spaces less than 0.8 microns wide between metal interconnect in the second and third dielectric layer of an integrated circuit without creating keyhole voids in such layers.

A further objective is to provide such an interlevel dielectric employing a process using SOG but which removes all SOG laid down during the intermediate process steps.

A still further objective is to provide a process which uses only the well known processes and materials as heretofore used.

In accordance with the present invention, a process is provided which overcomes the problem of the formation of voids in the interlayer dielectric for metal interconnect layers 2 and 3 for spaces smaller than 0.8 microns. Although CVD deposited oxide has a very high level of conformity to the surface being coated, it is not perfectly conformal, and as the aspect ratios of the spaces between interconnect metal strips become greater and more demanding, this problem has become more severe. We believe we are the first to appreciate that even though the aspect ratio of the spaces in the more dense new integrated circuits exceeded the specification for the RIE etch back process for voidless interlevel dielectric oxide that it would be possible to modify the process with an intermediate step to retain aspect ratios within the process specification.

In our inventive process, we add a step to the prior art etchback process of FIG. 1 for voidless dielectric fill. In this step, we enable reduction of the aspect ratio of the space between the interconnect metal to the same range of aspect ratio as in the prior art. By so doing, we extend the range of the prior art process so that it can be continued to be used. Specifically, we have discovered that if we apply a single spin of low viscosity SOG, such as Allied 111, after a first thin layer of conformal PETEOS dielectric has been applied over the metal, that the SOG will fill the narrow spaces between the interconnects by capillary action. SOG etches slightly faster than PETEOS. Accordingly, if we etchback with RIE until nearly all the PETEOS over the metal is removed, the SOG will also be removed and there will be oxide fillets formed on the metal sidewalls as depicted in FIG. 3B and the aspect ratio of the spaces will be substantially the same as the prior art. A second thick, overlain layer of PETEOS will now fill the interconnect spaces without voids because of the fact that the sloped sides are now within the known successful aspect ratio for the prior art process. We are not aware of any prior use of SOG for filling large aspect ratio spaces. Heretofore, SOG was used for smoothing in the planarization process steps. In these processes, the aspect ratios are low.

DETAILED DESCRIPTION OF THE INVENTION

Figure 3C:
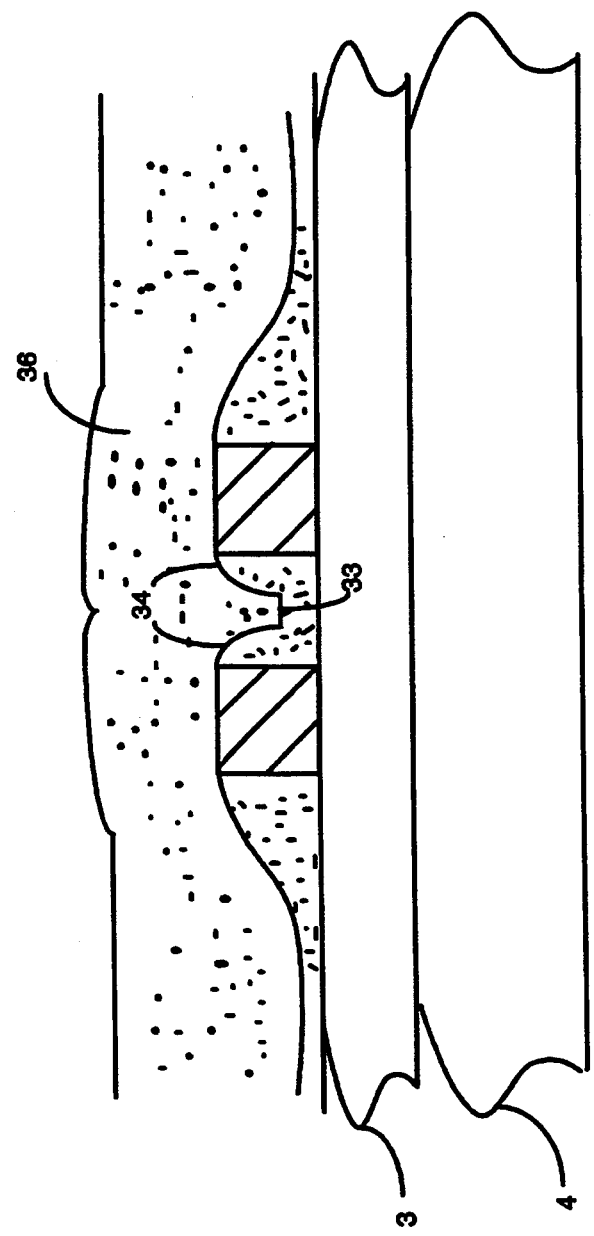
FIG. 3C is the cross section of the inventive process after the second PETEOS layer is applied over the intermediate state of FIG. 3B.
Figure 3A:
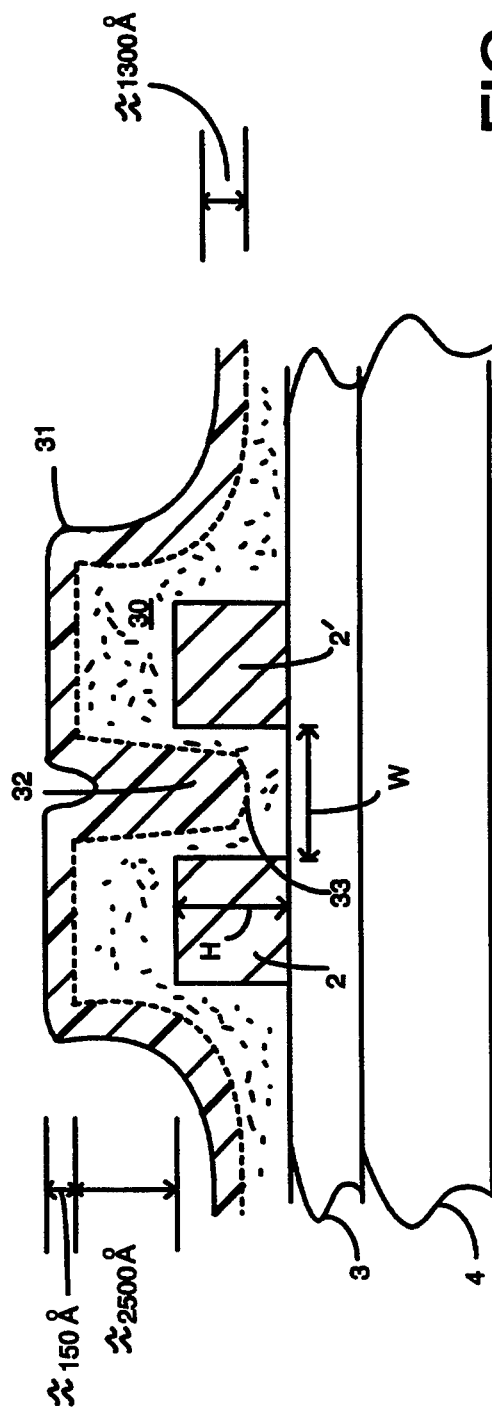
FIG. 3A is illustrative of the cross section of the first part of the inventive process.
Figure 3B:
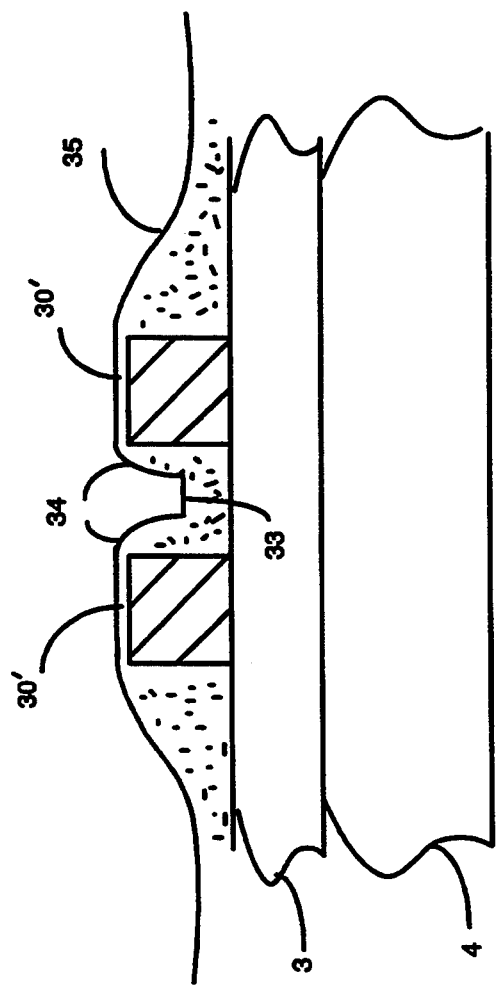
FIG. 3B is illustrative of cross section of the FIG. 3A embodiment after etchback as the second part of the invention process.

With reference to FIG. 3A-3C, the steps of the process of our invention are explained. Interconnect metal strips 2 and 2' are illustrative of level 2 and/or level 3 of interconnect metal cross section on an integrated circuit. The space aspect ratio, i.e., the ratio H/W, for a W of as low as 0.55 microns for the space between 2 and 2' can be as high as 1.82 and can be successfully filled by our technique.

A thin layer of conformal dielectric 30, usually a CVD PETEOS oxide, is applied over the metal 2 and 2'. Tetra-ethyl orthosilicate is deposited at $\approx 400°$ C. using plasma enhanced chemical vapor deposition such as enabled by the Novellus PETEOS system. The layer is applied thin enough so that the flat bottom of the space 33 is clearly defined and the side wall i.e. approximately 2500 Å as shown in FIG. 3A oxide in the space do not bridge over the space. Next, a single spin of a low viscosity, i.e. spin on glass (SOG) is applied to the wafer and the SOG covers the surface 30 in a thin layer 31 approximately six percent as thick as the immediately underlying PETEOS layer, i.e. 150 Å as shown in FIG. 3A. We used Allied 111. A plug 32 of the SOG collects by capillary action at the bottom of the narrow space 33. The SOG is hardened, using known procedures and temperatures, as specified by the manufacturer. We used 1 minute at several temperatures, the last temperature being approximately 250° C. Hard curing is not required since the RIE etch rate doesn't differ significantly.

Figure 1:
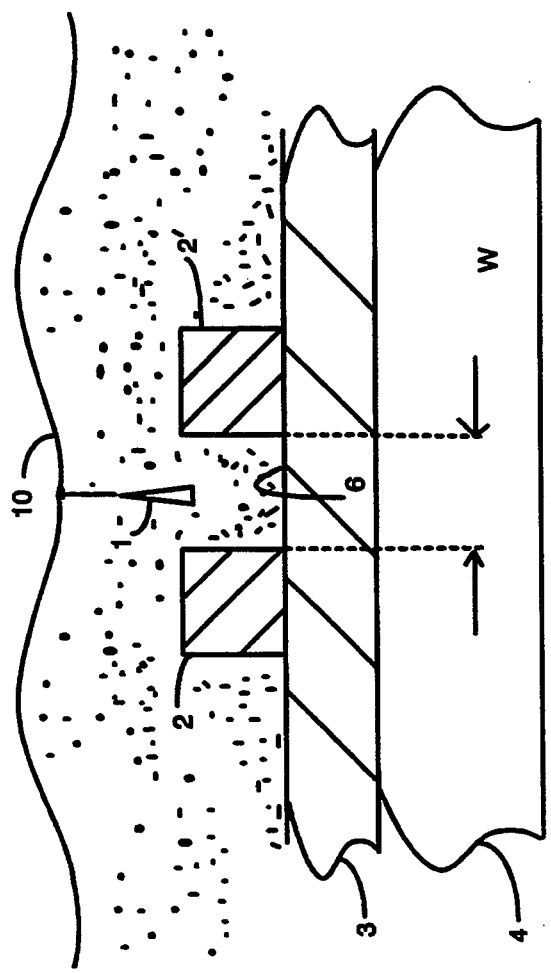
FIG. 1 is an illustrative integrated circuit cross section drawing showing prior art dielectric interlevel keyhole defect.
Figure 2A:
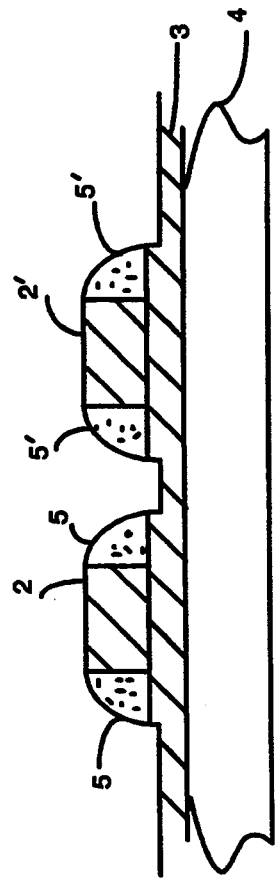
FIG. 2A is illustrative cross section of a successful prior art oxide etchback side wall fillet forming approach.
Figure 2B:
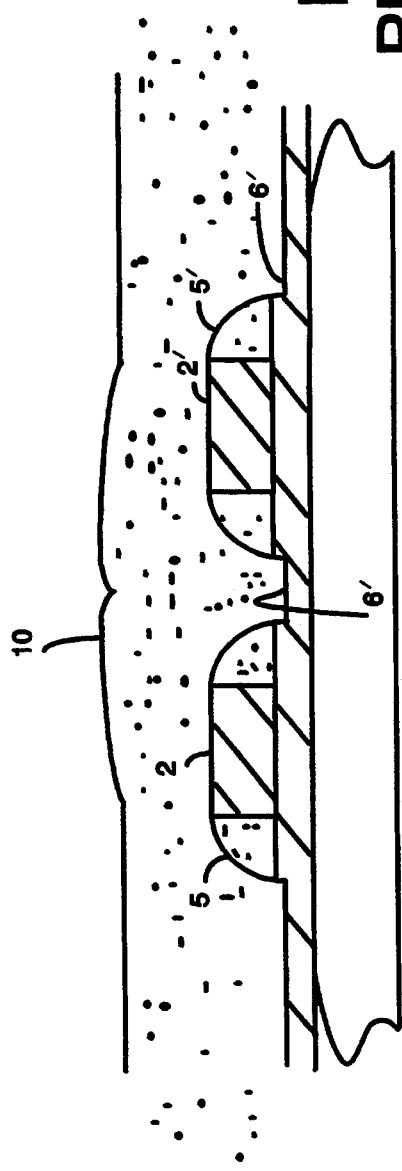
FIG. 2B is illustrative of the process of the prior art FIG. 2A etchback after a CVD deposition is applied over the sidewall fillets.

Plasma dry etch is preferred, such as magnetic enhanced reactive ion etching (MERLE) employing the Applied Materials P5000 oxide etcher, using conventional $CF_4$/Argon chemistry. The etching process is stopped when all SOG is removed or a thin layer 30' of PETEOS remains. Approximately 90% of the PETEOS is removed as determined by time of the etch. We time the etch and stop before the metal is exposed. This is attainable if the SOG etch rate is slightly greater or equal to the PETEOS etch rate. Other sacrificial formulations of low viscosity, such as Allied 111 SOG, should also be adequate. Other materials with an etch rate close to CVD oxide etch rate which can flow into the narrow spaces and harden there without introducing contaminants would be adequate for our process. As can be seen with reference to FIG. 3B, fillets 34 and 35 are formed as in the prior art. However, even though the space W in FIG. 3A is much smaller than the equivalent space in FIG. 2A, the general shape of the space between 2 and 2' in FIG. 3C has substantially the same aspect ratio by virtue of the fact that the SOG plug 32 slowed down the etch rate in the central region of the space. As shown in FIG. 3C, a final thick PETEOS oxide layer is deposited over the metal, filling all of the space, without any voids. Our experiments have shown this process will reliably extend the process down to the interconnect space width of 0.55 microns for a metal height of 1.0 microns, or an aspect ratio of 1.818 and lower. Also, note in connection with FIG. 3C, that planarization processes still need to be applied after our process is completed.

If the described process were to obtain to the second layer dielectric, the layer 3 in FIGS. 3A-3C, would represent the first metal interconnect layer including the dielectric. If the processes are descriptive of the third layer or fourth layer, the layer 3 in these figures would simply represent the next lower level.

The invention herein has been described in conjunction with specific embodiments of the drawings. It is not our intention to limit our invention to any specific embodiment, and the scope of our invention should be determined by our claims.

With this in view,

What is claimed is:

1. An improved process for void free oxide fill of spaces between metal in a patterned metal interconnect layer of an integrated circuit comprising:

(a) depositing a first plasma enhanced oxide layer of approximately 2500 Å over said metal interconnect layer on said integrated circuit, said interconnect layer having spaces between metal strips, said first oxide layer being thin enough so that deposited oxide on the opposite side walls of said interconnect metal are not connected;

(b) applying an approximately 150 Å thick layer of hardenable sacrificial SOG material over said first plasma enhanced oxide layer, said SOG material forming a partial plug in said space between said metal interconnects, the viscosity of said layer of hardenable sacrificial SOG material selected so that it will flow into said spaces between said metal strips;

(c) simultaneously dry etching said oxide layer and said material plug until all of said SOG is removed and approximately 90% of said first plasma enhanced oxide layer has been removed; and (d) depositing a second layer of plasma enhanced oxide over said dry etched integrated circuit.

2. The process of claim 1 wherein said SOG material plug forms primarily by capillary action.

3. The process of claim 1 wherein the metal interconnect has a height (H) less than one micron and the width of some of the interconnect spaces (W) are equal to or greater than 0.55 microns and some of the interconnect spaces have an aspect ratio H/W greater than 1.0.

4. An improved method for depositing interlayer dielectric oxide to fill integrated circuit spaces between a patterned interconnect metal layer, the width of some of said spaces (W) being as narrow as 0.55 microns and having heights (H) on the order of 1.0 micron comprising:

(a) depositing a first layer of oxide over said patterned interconnect metal layer, said first oxide layer thickness being about the height of said interconnect metal strips;

(b) applying an approximately 150 Å thick layer of a hardenable SOG material having an etch rate greater than the etch rate of said oxide, said SOG material filling in the spaces between said interconnect metal strips;

(c) hardening said SOG layer;

(d) simultaneously backetching both said first layer of oxide and said hardened SOG material, until said hardened SOG material is entirely removed and approximately 90% of said first oxide layer is removed;

(e) depositing a second coating of said oxide over said etched integrated circuit, said second coating being a oxide;

(f) planarizing said second oxide coating;

(g) applying resist to said integrated circuit;

(h) patterning said resist for a third layer metallization;

(i) depositing said third layer metallization;

(j) repeating steps (a) through (e) over said third layer metallization.

5. The method of claim 4 wherein the step of simultaneously backetching consists of a plasma dry etch.

6. The method of claim 5 wherein said dry etch employs CF4 and Argon gases.

7. In an improved process for void free oxide fill of spaces between metal in a metal interconnect layer of an integrated circuit where the height (H) of said metal in said interconnect layer and a portion of the width of spaces (W) between said metal have an aspect ratio H/W greater than 1.0, the improvement comprising:

(a) depositing a first oxide layer over said metal interconnect layer on said integrated circuit, said first oxide layer being thin enough so that deposited oxide on the opposite side walls of said interconnect metal are not connected;

(b) applying a layer of hardenable sacrificial SOG material over said first oxide layer, said SOG material forming a partial plug in said spaces between said metal interconnect, said layer of SOG material being approximately six percent as thick as the thickness of said first oxide layer;

(c) simultaneously dry etching said oxide layer and said material plug until essentially all of the SOG is removed and approximately 90% of said oxide layer has been removed; and (d) depositing a second layer of oxide over said dry etched integrated circuit.

* * * * *